United States Patent
Jimenez et al.

(10) Patent No.: US 11,444,077 B2
(45) Date of Patent: Sep. 13, 2022

(54) ELECTRONIC DEVICE FOR ESD PROTECTION

(71) Applicant: STMicroelectronics SA, Montrouge (FR)

(72) Inventors: Jean Jimenez, Saint Theoffrey (FR); Boris Heitz, Grenoble (FR); Johan Bourgeat, Saint Pierre d'allev (FR); Agustin Monroy Aguirre, St Martin d'Heres (FR)

(73) Assignee: STMicroelectronics SA, Montrouge (FR)

( * ) Notice: Subject to any disclaimer, the term of this patent is extended or adjusted under 35 U.S.C. 154(b) by 345 days.

(21) Appl. No.: 16/696,045

(22) Filed: Nov. 26, 2019

(65) Prior Publication Data

US 2020/0098743 A1    Mar. 26, 2020

Related U.S. Application Data

(60) Continuation of application No. 15/982,443, filed on May 17, 2018, now Pat. No. 10,515,946, which is a
(Continued)

(30) Foreign Application Priority Data

Jan. 30, 2014    (FR) ...................................... 1450724

(51) Int. Cl.
*H01L 27/02*    (2006.01)
*H02H 9/04*    (2006.01)
(Continued)

(52) U.S. Cl.
CPC ...... *H01L 27/0262* (2013.01); *H01L 27/1027* (2013.01); *H01L 27/1203* (2013.01);
(Continued)

(58) Field of Classification Search
CPC ............. H01L 27/0262; H01L 27/1027; H01L 27/1203; H01L 29/74; H01L 29/7408;
(Continued)

(56) References Cited

U.S. PATENT DOCUMENTS 5,682,047 A * 10/1997 Consiglio ........... H01L 27/0262
                                                       361/111
5,932,916 A *  8/1999 Jung ................... H01L 27/0262
                                                       257/316
(Continued)

FOREIGN PATENT DOCUMENTS

WO      2011089179 A1    7/2011

*Primary Examiner* — Dharti H Patel
(74) *Attorney, Agent, or Firm* — Slater Matsil, LLP (57) ABSTRACT

A semiconductor device includes a thyristor disposed in a semiconductor body. The thyristor has an anode, a cathode, a first bipolar transistor located on an anode side, and a second bipolar transistor located on a cathode side. The first and second bipolar transistors are nested and connected between the anode and the cathode. A MOS transistor is disposed in the semiconductor body. The MOS transistor is coupled between a collector region and an emitter region of the second bipolar transistor. The MOS transistor has a gate region connected to the cathode via a resistive semiconductor region that incorporates at least a part of a base region of the second bipolar transistor.

20 Claims, 5 Drawing Sheets

Related U.S. Application Data continuation of application No. 15/199,454, filed on Jun. 30, 2016, now Pat. No. 9,997,512, which is a division of application No. 14/610,173, filed on Jan. 30, 2015, now Pat. No. 9,401,351.

(51) Int. Cl.

| | | |
|---|---|---|
| *H01L 27/12* | (2006.01) | |
| *H01L 27/102* | (2006.01) | |
| *H01L 29/74* | (2006.01) | |
| *H01L 29/87* | (2006.01) | |

(52) U.S. Cl.
CPC .......... *H01L 29/74* (2013.01); *H01L 29/7408* (2013.01); *H01L 29/7436* (2013.01); *H01L 29/87* (2013.01); *H01L 2924/1301* (2013.01); *H02H 9/046* (2013.01)

(58) Field of Classification Search
CPC ................ H01L 29/7436; H01L 29/87; H01L 2924/1301; H02H 9/046
USPC .......................................................... 361/56
See application file for complete search history.

(56) References Cited

U.S. PATENT DOCUMENTS

| | | |
|---|---|---|
| 7,910,950 B1 | 3/2011 | Vashchenko et al. |
| 9,401,351 B2 | 7/2016 | Jimenez et al. |
| 9,997,512 B2 | 6/2018 | Jimenez et al. |
| 2001/0025961 A1 | 10/2001 | Nakamura et al. |
| 2003/0214773 A1 | 11/2003 | Kitagawa |
| 2006/0091464 A1* | 5/2006 | Hiraoka .............. H01L 27/0262 257/355 |
| 2006/0244071 A1 | 11/2006 | Kondo |
| 2007/0262386 A1 | 11/2007 | Gossner et al. |
| 2008/0088993 A1 | 4/2008 | Entringer et al. |
| 2010/0103570 A1* | 4/2010 | Song ................... H01L 27/0262 257/E29.211 |
| 2010/0328826 A1 | 12/2010 | Salman et al. |
| 2011/0227127 A1* | 9/2011 | Ohta .................... H01L 27/0262 257/E27.032 |
| 2012/0170160 A1* | 7/2012 | Wang ...................... H02H 9/04 361/56 |
| 2012/0319204 A1 | 12/2012 | Benoist et al. |
| 2013/0113017 A1 | 5/2013 | Galy et al. |
| 2013/0141824 A1 | 6/2013 | Bourgeat et al. |
| 2014/0015052 A1* | 1/2014 | Fenouillet-Beranger .................... H01L 27/0262 257/348 |
| 2014/0159108 A1* | 6/2014 | Marreiro ............. H01L 27/0248 257/140 |
| 2014/0211346 A1 | 7/2014 | Gendron et al. |
| 2015/0041883 A1 | 2/2015 | Kimura et al. |
| 2015/0069424 A1 | 3/2015 | Willemen et al. |
| 2015/0124360 A1* | 5/2015 | Jack ........................ G06F 1/16 361/679.21 |

* cited by examiner

ELECTRONIC DEVICE FOR ESD PROTECTION

CROSS-REFERENCE TO RELATED APPLICATIONS

This application is a continuation of U.S. patent application Ser. No. 15/982,443, filed on May 17, 2018, which is a continuation of U.S. patent application Ser. No. 15/199,454, filed on Jun. 30, 2016 (now U.S. Pat. No. 9,997,512, issued on Jun. 12, 2018), which is divisional of U.S. patent application Ser. No. 14/610,173, filed on Jan. 30, 2015 (now U.S. Pat. No. 9,401,351, issued on Jul. 26, 2016), which claims the benefit of French Application No. 1450724, filed on Jan. 30, 2014, which applications are hereby incorporated by reference herein in their entirety.

TECHNICAL FIELD

The invention relates to electronic devices, and notably those designed for the protection of components against electrostatic discharges (ESD).

BACKGROUND

Generally speaking, the devices for protection against electrostatic discharges comprise a large number of diodes in series, for example, on the order of twenty for an electronic system to be protected operating at 15 volts.

In order to reduce the number of components, the U.S. Patent Application Pub. No. 2008/0088993 A1 provides a gated thyristor designed notably for the protection against electrostatic discharges. However, in certain cases, such a gated thyristor exhibits a significant instability and requires several triggering circuits to trigger the thyristor in the presence of an ESD pulse. The number of components for providing an ESD protection is reduced because such a thyristor needs two triggering circuits, which, for a reversible protection, leads to six components (two thyristors and four triggering circuits). However, the need for the presence of such a triggering system still leads to constraints on the surface occupation of such a protection circuit and may, in certain cases, turn out to be complex to implement.

SUMMARY

According to one embodiment, an electronic device is provided based on a gated thyristor which occupies less surface area, has an enhanced stability, and is self-triggering, in other words not requiring a specific triggering circuit to trigger it, notably in the presence of an ESD pulse.

According to one aspect, an electronic device is provided, comprising a thyristor having an anode, a cathode, a first bipolar transistor situated on the anode side, a second bipolar transistor situated on the cathode side, these two bipolar transistors being nested and connected between the anode and the cathode, an MOS transistor coupled between the collector region and the emitter region of the second bipolar transistor having a gate region connected to the cathode via a resistive semiconductor region incorporating at least a part of the base region of the second bipolar transistor.

This base region of the second bipolar transistor, which is situated on the cathode side and which is also the substrate region of the MOS transistor, offers an intrinsic resistance which, with the reverse capacitive NP junction between the base regions of the two bipolar transistors, allows the thyristor to be triggered when an ESD pulse occurs propagating from the anode towards the cathode, while at the same time ensuring its stability when it is connected to the terminals of a component in normal operation. Indeed, this base region, which is also the substrate region of the MOS transistor, is not floating but connected to the cathode.

Thus, the resistive-capacitive network allowing the thyristor to be triggered here is a network internal to the thyristor itself since it comprises a resistive path of the base region of the bipolar transistor situated on the cathode side and the capacitance of the reverse NP junction between the two base regions of the two bipolar transistors.

Although such a device may be fabricated in any technology, notably a bulk silicon technology, it is especially applicable to a technology of the silicon-on-insulator (or SOI) type.

Thus, according to one embodiment, the device is fabricated in a technology of the silicon-on-insulator type and comprises, within a semiconductor film situated on top of an insulating layer (commonly denoted by those skilled in the art under the acronym BOX: "Buried OXide") itself situated on top of a carrier substrate.

A first semiconductor region has a first type of conductivity, for example the N type of conductivity, and includes the base region of the first bipolar transistor (situated on the anode side) together with the collector region of the second bipolar transistor. A second semiconductor region has a second type of conductivity, for example the P type of conductivity, incorporating the resistive semiconductor region, the base region of the second bipolar transistor (situated on the cathode side) and the collector region of the first bipolar transistor (situated on the anode side). A third semiconductor region has the second type of conductivity and includes the anode and the emitter region of the first bipolar transistor. A fourth semiconductor region has the first type of conductivity and includes the cathode and the emitter region of the second bipolar transistor.

The gate region extends at least over the top of the base region and preferably also over the top of the emitter and collector region of the second bipolar transistor. A first metallization connects the gate region to a first location of the second semiconductor region and a second metallization connects a second location of the second semiconductor region to the fourth semiconductor region, the part of the second semiconductor region situated between the two locations forming the resistive semiconductor region.

According to another aspect, a circuit for protection against electrostatic discharges includes a first terminal, a second terminal and at least one electronic device such as defined hereinbefore having its anode connected to the first terminal and its cathode connected to the second terminal.

In such a manner as to provide bidirectionality of the protection, the protection circuit comprises, according to one embodiment, at least one other electronic device such as defined hereinbefore having its anode connected to the second terminal and its cathode connected to the first terminal.

According to another aspect, an input/output cell of an integrated circuit is provided, comprising an input/output lug, a first power supply terminal, designed for example to receive the power supply voltage Vdd, a second power supply terminal, designed for example to be connected to ground, a first protection circuit such as defined hereinbefore coupled between the first power supply terminal and the input/output lug, a second protection circuit such as defined hereinbefore coupled between the input/output lug and the second power supply terminal, and a third protection circuit such as defined hereinbefore coupled between the first power supply terminal and the second power supply terminal.

According to another aspect, an integrated circuit is provided comprising at least an input/output cell, such as defined hereinbefore.

According to yet another aspect, a method is provided for adjusting the trigger voltage of an electronic device such as defined hereinbefore, comprising an adjustment of the length of the resistive semiconductor region.

BRIEF DESCRIPTION OF THE DRAWINGS

Other advantages and features of the invention will become apparent upon examining the detailed description of non-limiting embodiments and their implementation, and of the appended drawings in which.

DETAILED DESCRIPTION OF ILLUSTRATIVE EMBODIMENTS

Figure 1:
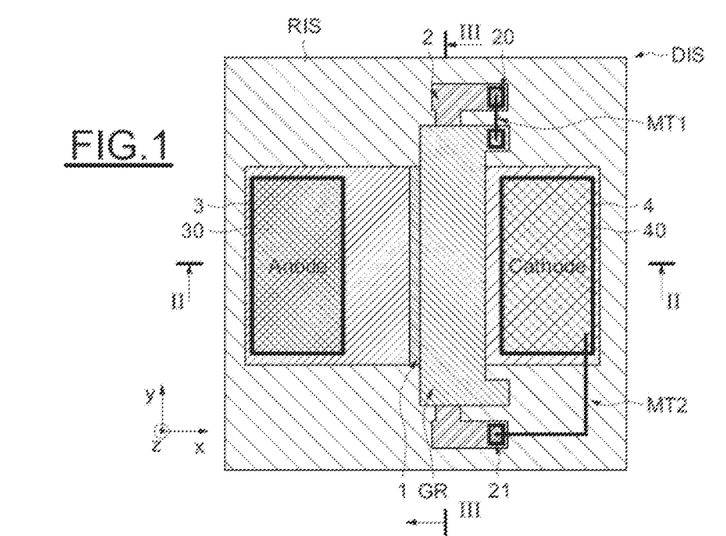
FIGS. 1 to 10 relate to various embodiments of the invention and their implementation.
Figure 2:
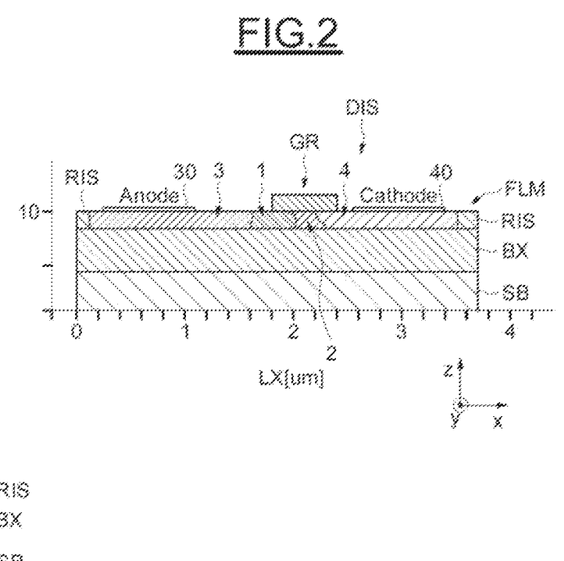
Figure 3:
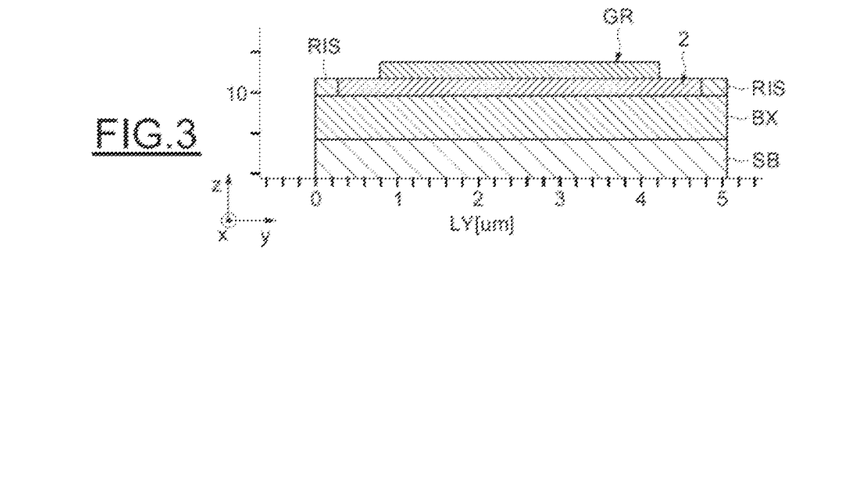

In FIGS. 1, 2, and 3, the reference DIS denotes an electronic device fabricated using a technology of the silicon-on-insulator (SOI) type. For example, the invention is fully functional on partially depleted SOI (PDSOI) bulk.

FIG. 2 is a cross-sectional view along the line II-II in FIG. 1, whereas FIG. 3 is a cross-sectional view along the line III-III in FIG. 1.

In such a technology, and as illustrated in these figures, the device DIS is fabricated within a semiconductor film FLM, having for example the P type of conductivity, supported by a layer of buried oxide BX, commonly denoted by those skilled in the art using the acronym BOX, itself supported by a semiconductor carrier substrate SB, for example also of the P type.

As illustrated in these figures, the device DIS is bounded by an insulating region RIS, for example of the shallow trench isolation (or STI) type.

The device DIS comprises, within this semiconductor film FLM for example made of silicon, a first semiconductor region 1 having a first type of conductivity, for example the N type of conductivity. A second semiconductor region 2 has a second type of conductivity opposite to the first, for example the P type of conductivity. A third semiconductor region 3 has the second type of conductivity, here the P type of conductivity. This third semiconductor region is doped P+, in other words, it is more highly doped than the second P-doped semiconductor region 2.

As will be seen hereinafter, this third semiconductor region 3 notably forms the anode of a thyristor and, for this purpose, comprises an area 30 comprising a metal silicide and forming an anode contact.

The device DIS furthermore comprises a fourth semiconductor region 4 having the first type of conductivity, in this case, the N type of conductivity, which notably forms a cathode for the thyristor. This fourth semiconductor region is more highly doped (doped N+) than the first semiconductor region 1 doped N. This region 4 also comprises an area 40 comprising a metal silicide and forming a cathode contact.

The device DIS also comprises an isolated gate region GR, which can be a semiconductor gate or, as a variant, a metal gate. As illustrated in FIG. 2, this gate region GR here covers, for example by means of a gate oxide, the semiconductor region 2, but also a part of the semiconductor regions 1 and 4. Indeed, as will be seen in more detail hereinafter, this gate GR is the gate of an MOS transistor and the fact that this gate GR covers a part of the semiconductor regions 1 and 4 allows any channel discontinuity in the semiconductor region 2 to be avoided.

Furthermore, as can be seen in FIG. 1, the semiconductor region 2 goes beyond the edge in the direction of the length, in other words in the direction of the y axis, of the gate region GR.

This overlap readily allows the formation of an electrical link between a first location 20 of this second semiconductor region 2 and the gate region GR. Here, this electrical link is formed by a metallization MT1 which can be formed for example at the first metallization level of the integrated circuit incorporating the device DIS.

This device furthermore comprises a second electrical link, also for example formed by a metallization MT2, between a second location 21 of the second semiconductor region 2 and the fourth semiconductor region 4.

The part of the second semiconductor region 2 situated between the two locations 20 and 21 forms a resistive semiconductor region having a resistance R2.

The device DIS is here fabricated using a 0.13 micron technology, and its width LX, measured along the x axis, is around 3 microns, whereas its length LY, measured along the y axis, is slightly less than 5 microns.

Figure 4:
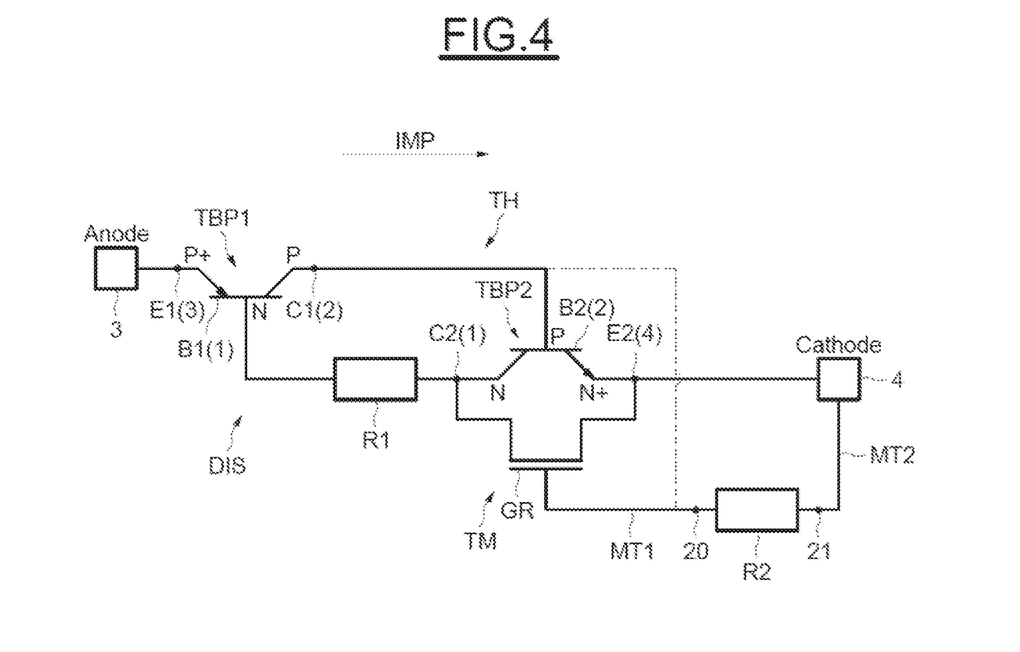

As illustrated in FIG. 4, which shows an equivalent electrical circuit diagram of the device DIS in FIGS. 1, 2 and 3, it can be seen that the device DIS comprises a thyristor TH having an anode, a cathode, a first bipolar transistor PNP referenced TBP1 situated on the anode side, a second bipolar transistor NPN referenced TBP2 situated on the cathode side.

These two transistors are nested and connected between the anode and the cathode. More precisely, the collector C1 of the first bipolar transistor TBP1 is connected to the base B2 of the second bipolar transistor TBP2 and the collector C2 of the second of the bipolar transistor TBP2 is connected to the base Bi of the first bipolar transistor TBP1.

The emitter E1 of the first bipolar transistor TBP1 is connected to (and forms) the anode 3 of the thyristor.

The emitter E2 of the second bipolar transistor TBP2 is connected to (and forms) the cathode 4 of the thyristor.

Furthermore, an MOS transistor TM is coupled between the collector C2 and the emitter E2 of the second bipolar transistor TBP2. The gate region GR of the MOS transistor TM is connected to the cathode via the metallization MT1, the resistor R2, the second resistive semiconductor region, and the metallization MT2.

The dashed line between the base B2 of the transistor TBP2 and the location 20 of the semiconductor region 1 represents schematically the fact that the base region B2 is not floating but is connected to the cathode using a portion of the region 1.

The first semiconductor region 1 incorporates the base region B1 of the first bipolar transistor TBP1, together with the collector region C2 of the second bipolar transistor TBP2.

The resistor R1 represents the resistance of this first semiconductor region.

The second semiconductor region 2 incorporates the resistive semiconductor region situated between the locations 20 and 21, together with the base region B2 of the second bipolar transistor TBP2 and the collector region C1 of the first bipolar transistor TBP1.

The third semiconductor region 3 incorporates the anode and the emitter region E1 of the first bipolar transistor TBP1, and the fourth semiconductor region 4 incorporates the cathode and the emitter region E2 of the second bipolar transistor TBP2.

It can be seen that the device DIS comprises the gated thyristor TH comprising the two nested bipolar transistors TBP1 and TBP2 together with the MOS transistor TM. The MOS transistor can inject a current into the base B2 of the transistor TBP2 (here an NPN transistor) and hence of improving the triggering of the thyristor.

When an ESD pulse IMP propagates from the anode towards the cathode, the voltage on the gate GR of the MOS transistor will increase thanks to the resistance R2 of the resistive semiconductor region and to the injection of current via the reverse capacitive NP junction between the first semiconductor region 1 and the second semiconductor region 2. At a certain moment, the device goes into lock (the thyristor triggers) and then goes into high injection mode.

The thyristor is then self-sustaining. The current flowing through the thyristor then needs to be canceled to recover the initial non-triggered state.

Figure 5:
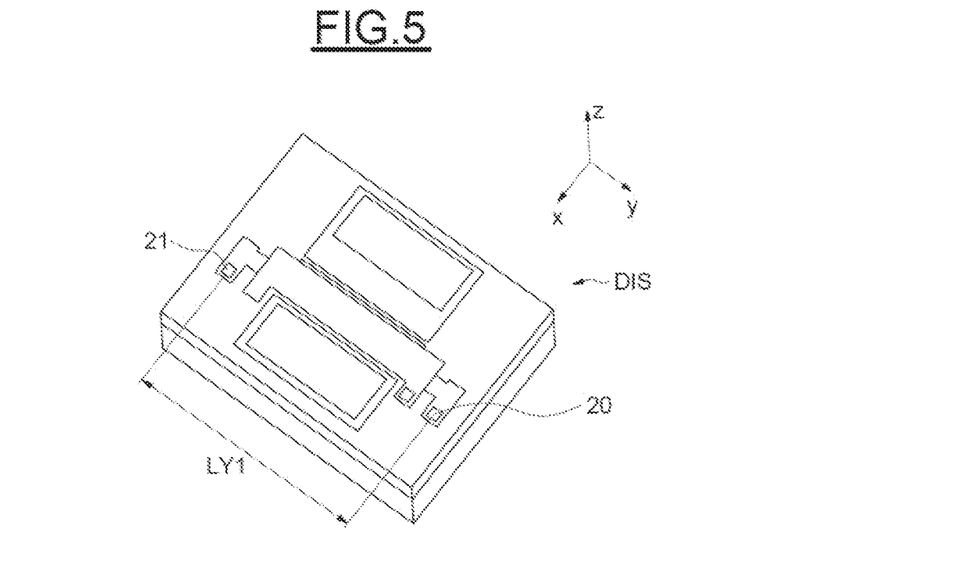

The value of the resistance R2 of the resistive semiconductor region situated between the locations 20 and 21 allows the trigger voltage of the thyristor to be adjusted. Thus, as illustrated in FIG. 5, for a length LY1 equal to 2.5 microns, a trigger voltage of around 4.6 volts is obtained.

Figure 6:
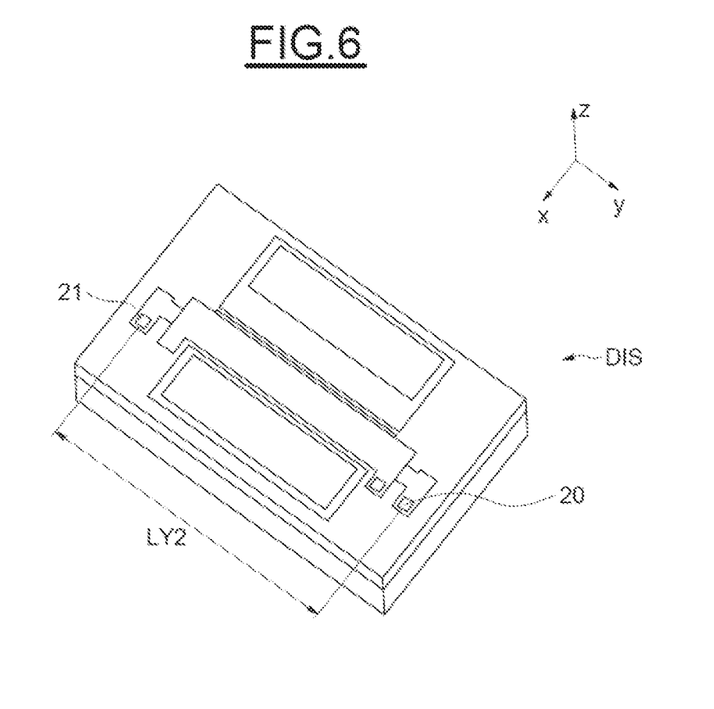

On the other hand, if the length of the device is increased, in other words, for a length LY2 greater than LY1, the trigger voltage is decreased. Thus, as illustrated in FIG. 6, for a length LY2 equal to 5 microns, a trigger voltage of around 4.2 volts is obtained.

Figure 7:
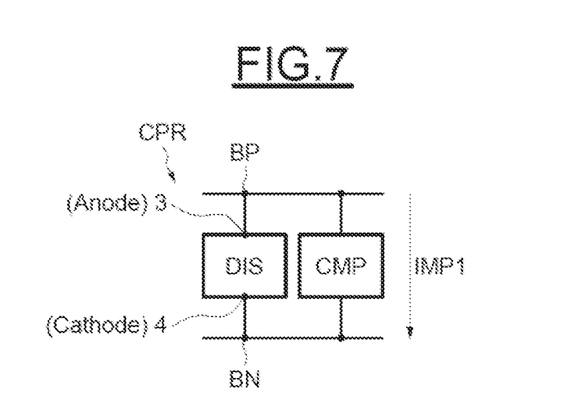

As illustrated in FIG. 7, the device DIS can be used as a circuit CPR for protecting an electronic component CMP against electrostatic discharges. The component CMP is connected to a first terminal BP and to a second terminal BN of the protection circuit. The electronic component may be a single component or else any electronic system to be protected.

By way of example, when the component CMP is in operation, the terminal BP can be connected to a voltage Vp positive and the terminal BN can be connected to a negative voltage Vn or equal to zero (ground). The fact that the base B2 of the bipolar transistor TBP2 (substrate of the MOS transistor TM) is not floating (since connected to the cathode) improves the stability of the device DIS, in other words, reduces the risk of a spurious triggering when the component is in operation.

When the component CMP is not in operation, it may be subjected to an electrostatic discharge typically resulting in a very short current pulse (typically a few microseconds) whose current peak is for example of the order of 2 amps and which occurs typically after 10 nanoseconds. Typically, this corresponds for example to a pulsed potential difference applied between the terminals BP and BN through an R-L-C equivalent circuit, whose peak voltage occurs after 10 nanoseconds with an intensity of 1 to 4 kVolts HBM, for example 4 kVolts HBM for 2.5 amps.

It is recalled here that the letters HBM stand for "Human Body Model" well known to those skilled in the art in the field of the protection against electrostatic discharges and notably denote an electrical circuit aimed at modelling an electrostatic discharge delivered by a human being and normally used for testing the sensitivity of devices to electrostatic discharges. This HBM electrical circuit, which is the R-L-C equivalent circuit mentioned hereinbefore and to which a high voltage is applied, notably comprises a capacitor of wo pF, which discharges through a resistance of 1.5 kilo-ohms in the device to be tested. Thus, in the present case, an electrostatic discharge of 4 kilovolts HBM means that a potential difference of 4 kilovolts is applied to the HBM electrical circuit.

This current pulse should then flow through the device DIS and not through the component CMP to be protected.

The device DIS accordingly aims to absorb this current pulse and to avoid over-voltages at the terminals of the component CMP.

For this purpose, the anode 3 of the device DIS is connected to the first terminal BP, whereas the cathode 4 of the device is connected to the second terminal BN.

The component CMP is then protected against ESD pulses IMP propagating from the terminal BP towards the terminal BN.

Figure 8:
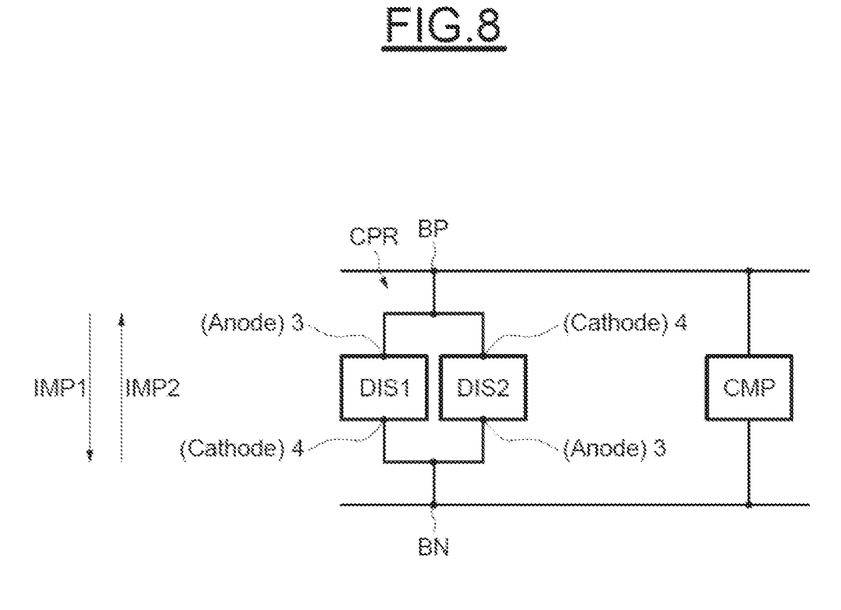

In order to allow a bidirectional protection, it is for example provided, as illustrated in FIG. 8, for the protection circuit CPR to comprise a first device DIS1 with a structure analogous to the device DIS that has just been described, whose anode is connected to the terminal BP and whose cathode is connected to the terminal BN, together with a second device DIS2 with a structure analogous to the first device DIS1, but whose anode is this time connected to the terminal BN and whose cathode is this time connected to the terminal BP. The component CMP can then be protected against the ESD pulses IMP1 propagating from the terminal BP towards the terminal BN and also against ESD pulses IMP2 propagating from the terminal BN towards the terminal BP.

It is particularly advantageous to incorporate devices for protection against electrostatic discharges of the type of those which have just been described into an input-output cell of an integrated circuit.

Figure 9:
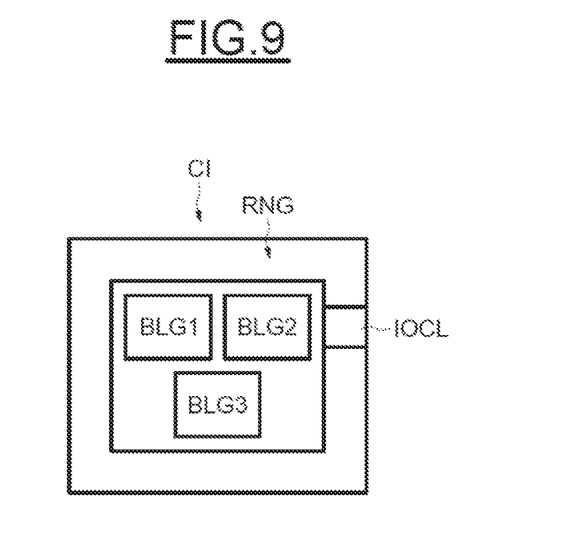

By way of non-limiting example, such input/output cells IOCL may be disposed, as illustrated in FIG. 9, within a ring RNG on the periphery of the integrated circuit CI.

These cells IOCL can for example transport power supply voltages and/or data signals destined for and/or coming from functional blocks BLG1-BLG3 of the integrated circuit.

Figure 10:
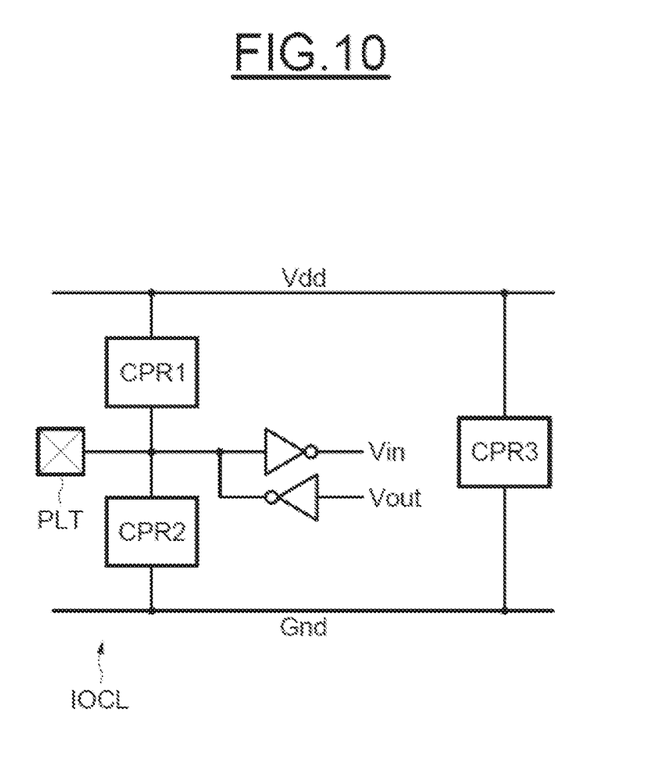

As illustrated in FIG. 10, the input-output cell comprises for example an input-output lug PLT for receiving/transmitting a signal. This cell comprises two supply terminals Vdd and Gnd. A first bidirectional protection circuit CPR1 of the type of that which has just been described hereinbefore is disposed between the power supply terminal Vdd and the input-output lug PLT.

A second bidirectional protection circuit CPR2 is disposed between the input-output lug PLT and the second power supply terminal Gnd. Finally, a third bidirectional protection circuit CPRS is disposed between the two supply terminals Vdd and Gnd.

Thus, such an input-output cell is protected, in an extremely simple manner, against an electrostatic discharge occurring between the two supply terminals Vdd and Gnd, and also against an electrostatic discharge that may occur either between the power supply terminal Vdd and the input-output lug or between the input-output lug and the power supply terminal Gnd. The functional blocks connected between the two terminals Vdd and Gnd are therefore also protected against an electrostatic discharge.

What is claimed is:
1. A method comprising:
providing an electrostatic discharge (ESD) pulse to an electronic device, the electronic device comprising a thyristor having an anode terminal and a cathode terminal, the ESD pulse provided to the anode terminal of the thyristor;

injecting a current at the anode terminal of the thyristor in response to the ESD pulse, the current flowing from the anode terminal to the cathode terminal, a value of the current corresponding to an intrinsic resistance of the thyristor;

self-triggering the thyristor in accordance with a trigger voltage of the thyristor, the trigger voltage corresponding to a length of the electronic device and to the current; and cancelling the current in response to the self-triggering of the thyristor.

2. The method of claim 1, wherein the thyristor further comprises:
a first and a second bipolar transistor, the first bipolar transistor coupled to the anode terminal, the second bipolar transistor coupled to the cathode terminal; and
a metal-oxide semiconductor (MOS) transistor coupled to the second bipolar transistor.

3. The method of claim 1, wherein self-triggering the thyristor comprises the electronic device going into high injection mode.

4. The method of claim 1, wherein increasing the trigger voltage corresponds to a decrease in the length of the electronic device.

5. The method of claim 1, wherein decreasing the trigger voltage corresponds to an increase in the length of the electronic device.

6. The method of claim 1, wherein the ESD pulse is delivered by a human body.

7. A method for an electrostatic discharge (ESD) protection in an integrated circuit comprising a protection circuit, the protection circuit comprising a first and a second electronic device, the method comprising:
providing an ESD pulse to an anode terminal of a thyristor of the first electronic device, the thyristor of the first electronic device having the anode terminal and a cathode terminal;
injecting a current at the anode terminal in response to the ESD pulse, the current flowing from the anode terminal to the cathode terminal, a value of the current corresponding to an intrinsic resistance of the thyristor of the first electronic device; and
self-triggering the thyristor of the first electronic device in accordance with a trigger voltage of the thyristor of the first electronic device, the trigger voltage corresponding to a length of the first electronic device and to the current; and
cancelling the current in response to the self-triggering of the thyristor of the first electronic device.

8. The method of claim 7, further comprising:
providing a second ESD pulse in to a thyristor of the second electronic device, the thyristor of the second electronic device having a second anode terminal and a second cathode terminal;
injecting a second current at the second anode terminal in response to the second ESD pulse, the second current flowing from the second anode terminal to the second cathode terminal, a value of the second current corresponding to an intrinsic resistance of the thyristor of the second electronic device; and
self-triggering the thyristor of the second electronic device in accordance with a trigger voltage of the thyristor of the second electronic device, the trigger voltage corresponding to a length of the second electronic device and to the second current; and
cancelling the second current in response to the self-triggering of the thyristor of the second electronic device.

9. The method of claim 8, wherein the integrated circuit further comprises an electronic component coupled to the protection circuit, the method further comprising protecting the electronic component from the first and the second ESD pulse.

10. The method of claim 7, wherein the anode terminal of the first electronic device is coupled to the cathode terminal of the second electronic device.

11. The method of claim 10, wherein the anode terminal of the second electronic device is coupled to the cathode terminal of the first electronic device.

12. The method of claim 7, wherein the protection circuit provides bi-directional ESD protection.

13. The method of claim 7, wherein an input-output cell of the integrated circuit is within a ring on a periphery of the integrated circuit, wherein the method further comprises protecting the integrating circuit based on an ESD discharge on the periphery of the integrated circuit.

14. A method for electrostatic discharge (ESD) protection, the method comprising:
providing a resistive path between an anode of a thyristor to a cathode of the thyristor;
exposing the anode of the thyristor to an ESD pulse;
injecting current at a reverse capacitive NP junction in a bipolar transistor of the thyristor in response to the exposing to the ESD pulse;
increasing a gate voltage of a metal oxide semiconductor (MOS) transistor based on the current and an intrinsic resistance at a section of the resistive path from a gate of the MOS transistor to the cathode; and
triggering the thyristor into a high injection mode based on a trigger voltage of the thyristor.

15. The method of claim 14, wherein the trigger voltage of the thyristor is adjusted based on the intrinsic resistance.

16. The method of claim 14, wherein the trigger voltage of the thyristor is increased by decreasing a length of the section of the resistive path from the gate of the MOS transistor to the cathode.

17. The method of claim 14, wherein the trigger voltage of the thyristor is decreased by increasing a length of the section of the resistive path from the gate of the MOS transistor to the cathode.

18. The method of claim 14, wherein the thyristor is coupled to an electronic component, the method further comprising protecting the electronic component by triggering the thyristor into the high injection mode.

19. The method of claim 14, wherein the ESD pulse is delivered by a human body.

20. The method of claim 14, wherein increasing the trigger voltage corresponds to a decrease in a length of an electronic device, and wherein decreasing the trigger voltage corresponds to an increase in the length of the electronic device.

* * * * *